United States Patent
Hwang et al.

(10) Patent No.: US 10,720,199 B2
(45) Date of Patent: Jul. 21, 2020

(54) BUFFERING CIRCUIT, AND SEMICONDUCTOR APPARATUS AND SYSTEM INCLUDING BUFFERING CIRCUIT

(71) Applicant: SK hynix Inc., Icheon-si, Gyeonggi-do (KR)

(72) Inventors: Kyu Dong Hwang, Cheongju-si (KR); Dae Han Kwon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/218,181

(22) Filed: Dec. 12, 2018

(65) Prior Publication Data

US 2019/0252013 A1    Aug. 15, 2019

(30) Foreign Application Priority Data

Feb. 14, 2018 (KR) .................. 10-2018-0018510

(51) Int. Cl.
*G11C 7/10* (2006.01)
*G11C 7/22* (2006.01)
*G11C 13/00* (2006.01)

(52) U.S. Cl.
CPC ............ *G11C 7/225* (2013.01); *G11C 7/1051* (2013.01); *G11C 7/1078* (2013.01); *G11C 13/00* (2013.01)

(58) Field of Classification Search
CPC ....... G11C 7/225; G11C 7/1051; G11C 7/1078; G11C 13/00
See application file for complete search history.

(56) References Cited

U.S. PATENT DOCUMENTS

| | | | |
|---|---|---|---|
| 6,118,333 A * | 9/2000 | Oda ....................... | G11C 7/22 327/292 |
| 7,271,623 B2 | 9/2007 | Palmer | |
| 7,382,168 B2 * | 6/2008 | Bhattacharya ... | H03K 19/01852 326/38 |
| 8,421,498 B2 * | 4/2013 | Ichikawa ......... | H03K 19/00384 326/30 |
| 8,441,281 B2 * | 5/2013 | Kothandaraman | ........................ H03K 19/09432 326/30 |
| 9,419,564 B2 | 8/2016 | Tajalli | |

* cited by examiner

*Primary Examiner* — Pho M Luu
(74) *Attorney, Agent, or Firm* — William Park & Associates Ltd.

(57) ABSTRACT

A buffering circuit includes a first signal input/output unit that generates an output bar signal in response to an input signal, a second signal input/output unit that generates an output signal in response to an input bar signal, and a connection unit that electrically connects and disconnects an output node of the first signal input/output unit and a current sink node of the second signal input/output unit to/from each other in response to a control signal, and electrically connects and disconnects a current sink node of the first signal input/output unit and an output node of the second signal input/output unit to/from each other in response to the control signal.

19 Claims, 4 Drawing Sheets

FIG.2
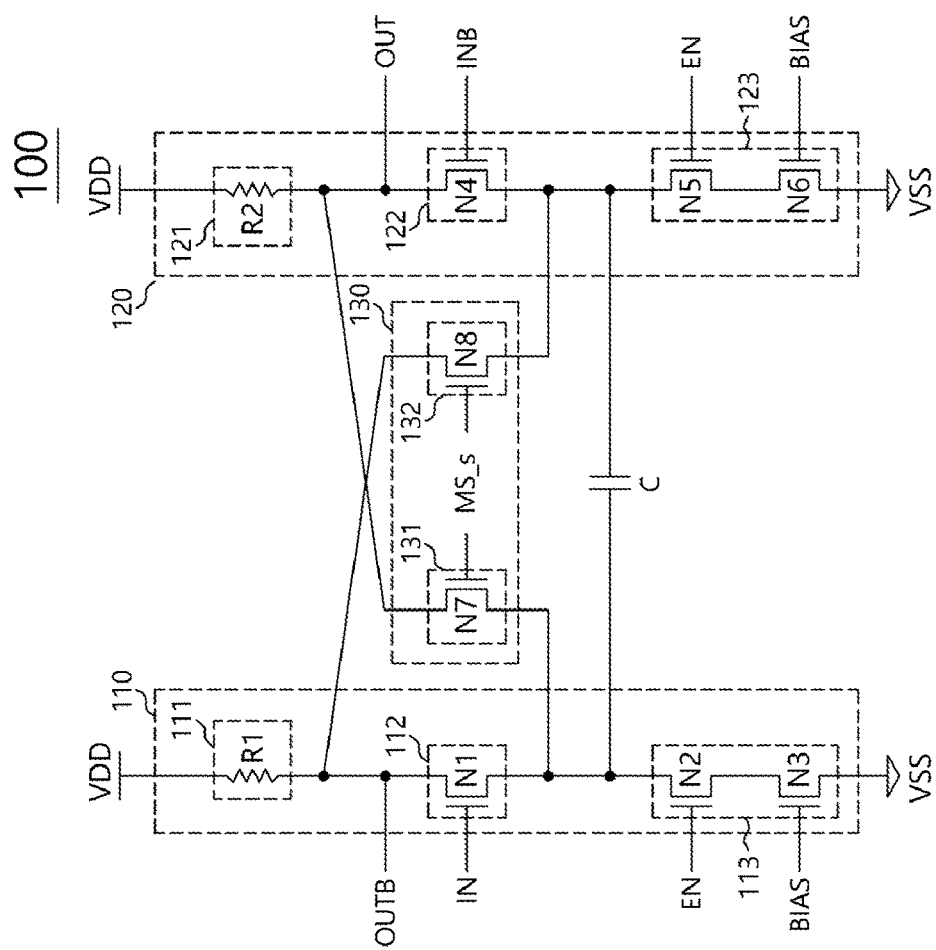
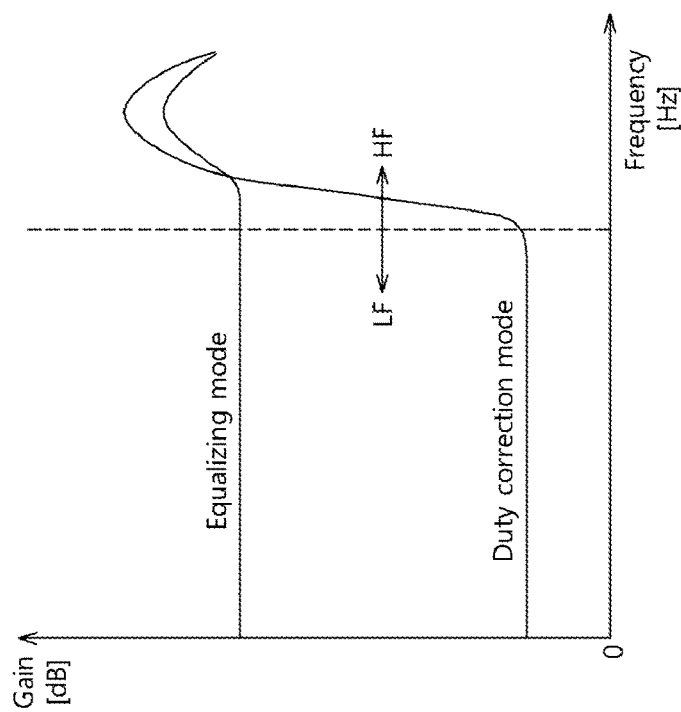

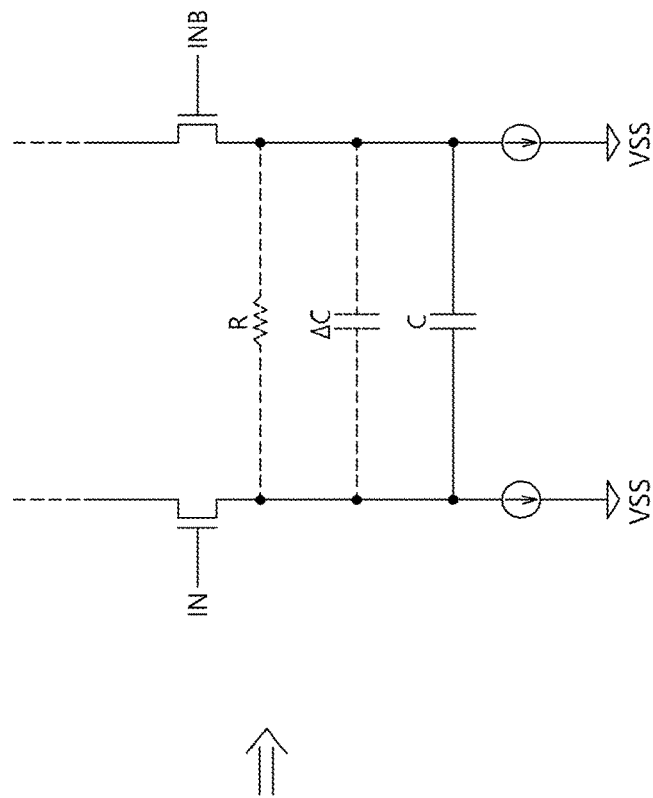
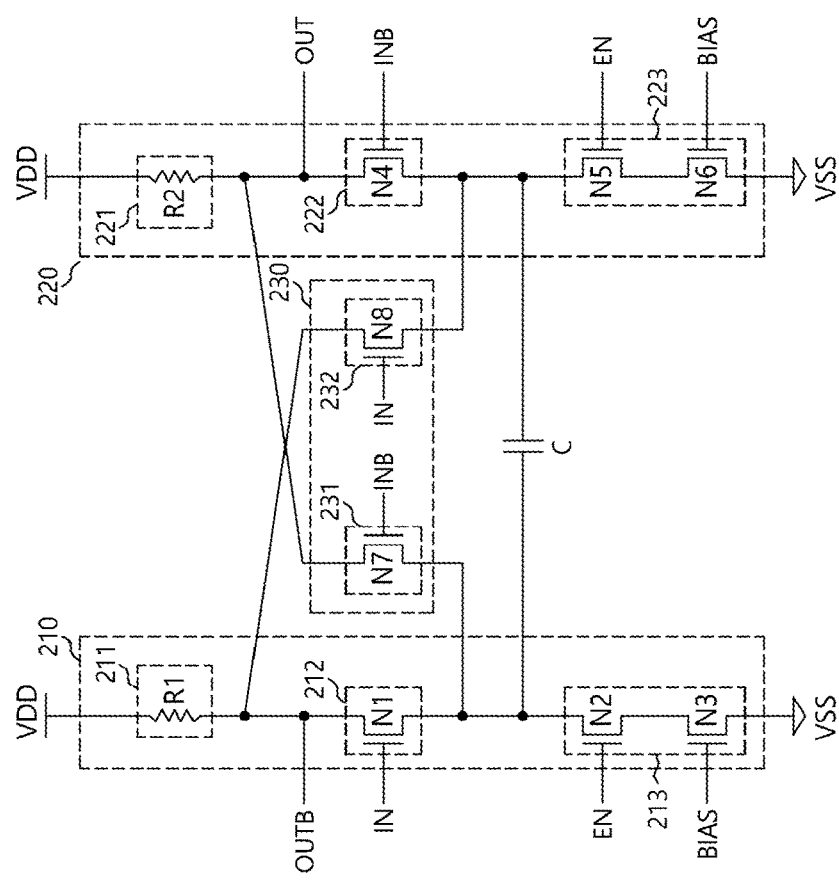
FIG.4

BUFFERING CIRCUIT, AND SEMICONDUCTOR APPARATUS AND SYSTEM INCLUDING BUFFERING CIRCUIT

CROSS-REFERENCES TO RELATED APPLICATION

The present application claims priority under 35 U.S.C. § 119(a) to Korean application number 10-2018-0018510, filed on Feb. 14, 2018, in the Korean Intellectual Property Office, which is incorporated herein by reference in its entirety.

BACKGROUND

1. Technical Field

Various embodiments generally relate to a semiconductor integrated circuit, and, more particularly, to a buffering circuit, and a semiconductor apparatus and a system including the buffering circuit.

2. Related Art

An electronic device includes many elements. Among many elements included in the electronic device, semiconductor apparatuses are configured to transmit/receive electrical signals.

The semiconductor apparatuses are configured to transmit/receive the electrical signals to/from one another, wherein each semiconductor apparatus includes a transmission circuit and a reception circuit.

The transmission circuit operates when a signal is outputted to another semiconductor apparatus, and the reception circuit operates when a signal is received from another semiconductor apparatus.

As the semiconductor apparatus operates at a higher speed, the transmission circuit and the reception circuit included in the semiconductor apparatus should also output a signal or receive a signal at a higher speed.

In order to accurately input/output a signal at a higher speed, the transmission circuit for amplifying and outputting a signal and the reception circuit for amplifying and receiving a signal may include an amplification circuit.

SUMMARY

In an embodiment, a buffering circuit includes: a first signal input and output (input/output) unit that generates an output bar signal in response to an input signal; a second signal input/output unit that generates an output signal in response to an input bar signal; and a connection unit that electrically connects and disconnects an output node of the first signal input/output unit and a current sink node of the second signal input/output unit to/from each other in response to a control signal, and electrically connects and disconnects a current sink node of the first signal input/output unit and an output node of the second signal input/output unit to/from each other in response to the control signal.

In an embodiment, a buffering circuit includes: a first signal input unit that decreases a level of an output bar signal as a level of an input signal increases; a second signal input unit that decreases a level of an output signal as a level of an input bar signal increases; and a connection unit that additionally decreases the level of the output bar signal as the level of the input signal increases or additionally decreases the level of the output signal as the level of the input bar signal increases.

In an embodiment, a buffering circuit includes: a first signal input and output (input/output) unit configured to generate an output bar signal in response to an input signal; a second signal input/output unit configured to generate an output signal in response to an input bar signal; and a connection unit configured to electrically connect the first and second signal input/output units to operate the buffer circuit in an equalizing mode and to electrically disconnect the first and second signal input/output units to operate the buffer circuit in a duty correction mode.

BRIEF DESCRIPTION OF THE DRAWINGS

FIG. 2 is a configuration diagram and a graph of a buffering circuit in accordance with an embodiment.

FIG. 4 illustrates an equivalent circuit of the buffering circuit illustrated in FIG. 3.

DETAILED DESCRIPTION

Hereinafter, a buffering circuit, and a semiconductor apparatus and a system including the same will be described below with reference to the accompanying drawings through various examples of embodiments.

Figure 1:
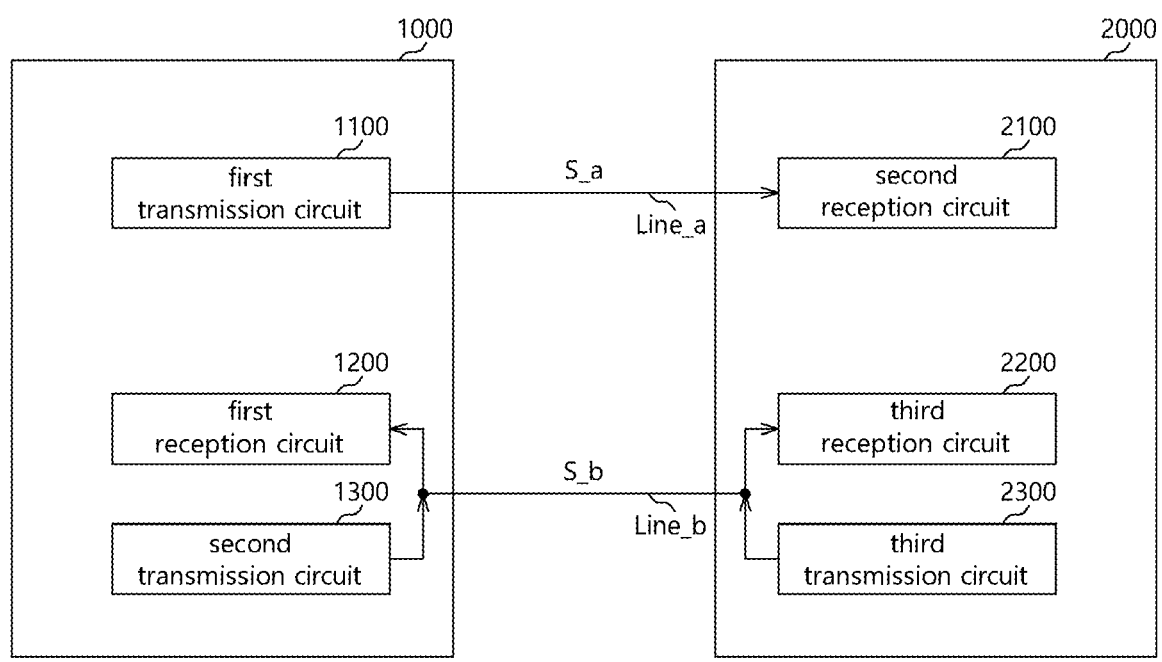
FIG. 1 is a configuration diagram of a system in accordance with an embodiment.

As illustrated in FIG. 1, a system in accordance with an embodiment may include a first semiconductor apparatus 1000 and a second semiconductor apparatus 2000.

The first semiconductor apparatus 1000 and the second semiconductor apparatus 2000 may be electronic elements that communicate with each other. The first semiconductor apparatus 1000 may be a master apparatus and the second semiconductor apparatus 2000 may be a slave apparatus that operates under the control of the first semiconductor apparatus 1000. For example, the first semiconductor apparatus 1000 may be a host apparatus such as a processor, wherein the processor may include a central processing unit (CPU), a graphic processing unit (GPU), a multimedia processor (MMP), and a digital signal processor. Furthermore, the first semiconductor apparatus 1000 may be implemented in the form of a system on chip by combining processor chips (for example, application processors (APs)) having various functions with one another.

The second semiconductor apparatus 2000 may be a memory, wherein the memory may include a volatile memory and a nonvolatile memory. The volatile memory may include a static RAM (SRAM), a dynamic RAM (DRAM), and a synchronous RAM (SDRAM), and the nonvolatile memory may include a read only memory (ROM), a programmable ROM (PROM), an electrically erase and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and the like.

The first and second semiconductor apparatuses 1000 and 2000 may be electrically connected to each other through a plurality of signal transmission lines Line_a and Line_b. The plurality of signal transmission lines Line_a and Line_b may be channels, links, or buses, etc. The first signal transmission line Line_a may be a one-way channel that transfers a first signal S_a from the first semiconductor apparatus 1000 to the second semiconductor apparatus 2000. The first signal S_a may include signals, such as commands, clocks, and addresses, which are required for controlling the second semiconductor apparatus 2000. The second signal transmission line Line_b may be a two-way channel by which the first and second semiconductor apparatuses 1000 and 2000 can transmit and receive (transmit/receive) a second signal S_b to and from (to/from) each other. The second signal S_b may include data and a data strobe signal.

The first and second semiconductor apparatuses 1000 and 2000 may include a transmission circuit and a reception circuit, respectively.

The first semiconductor apparatus 1000 may include a first transmission circuit 1100, a first reception circuit 1200, and a second transmission circuit 1300. The first transmission circuit 1100 may output the first signal S_a to the second semiconductor apparatus 2000 through the first signal transmission line Line_a. The first reception circuit 1200 may receive the second signal S_b from the second semiconductor apparatus 2000 through the second signal transmission line Line_b. The second transmission circuit 1300 may output the second signal S_b to the second semiconductor apparatus 2000 through the second signal transmission line Line_b.

The second semiconductor apparatus 2000 may include a second reception circuit 2100, a third reception circuit 2200, and a third transmission circuit 2300. The second reception circuit 2100 may receive the first signal S_a from the first semiconductor apparatus 1000 through the first signal transmission line Line_a. The third reception circuit 2200 may receive the second signal S_b from the first semiconductor apparatus 1000 through the second signal transmission line Line_b. The third transmission circuit 2300 may output the second signal S_b to the first semiconductor apparatus 1000 through the second signal transmission line Line_b.

The first to third reception circuits 1200, 2100, and 2200 illustrated in FIG. 1 may include a buffering circuit 100 illustrated in FIG. 2, respectively.

As illustrated in FIG. 2, the buffering circuit 100 may include a first signal input/output unit 110, a second signal input/output unit 120, a connection unit 130, and a capacitor C.

The first signal input/output unit 110 may generate an output bar signal OUTB in response to an input signal IN when an enable signal EN is enabled, at a high level. For example, when the enable signal EN is enabled, at a high level, the first signal input/output unit 110 may output the output bar signal OUTB as a low level signal if the input signal IN is at a high level. When the enable signal EN is enabled at a high level, the first signal input/output unit 110 may output the output bar signal OUTB as a high level signal if the input signal IN is at a low level.

The first signal input/output unit 110 may include a first resistive unit 111, a first signal input unit 112, and a first current sink unit 113.

The first resistive unit 111 may include a first resistive element R1. The first resistive element R1 receives an external voltage VDD through one end thereof.

The first signal input unit 112 may transfer a current transferred from the first resistive unit 111 to the first current sink unit 113 by a current amount corresponding to a voltage level of the input signal IN. For example, the first signal input unit 112 may transfer a large amount of current to the first current sink unit 113 as the voltage level of the input signal IN increases.

The first signal input unit 112 may include a first transistor N1. The first transistor N1 has a gate that receives the input signal IN, a drain electrically connected to the other end of the first resistive element R1, and a source electrically connected to the first current sink unit 113. The output bar signal OUTB is outputted from a node at which the first resistive unit 111 and the first signal input unit 112 are electrically connected to each other. Accordingly, the node, at which the first resistive unit 111 and the first signal input unit 112 are electrically connected to each other, may be called an output node.

When the enable signal EN is enabled, the first current sink unit 113 may transfer a current transferred from the first signal input unit 112 to a ground terminal VSS by a current amount corresponding to a voltage level of a bias voltage BIAS.

The first current sink unit 113 may include second and third transistors N2 and N3. The second transistor N2 has a gate that receives the enable signal EN and a drain electrically connected to the source of the first transistor N1. The third transistor N3 has a gate that receives the bias voltage BIAS, a drain electrically connected to a source of the second transistor N2, and a source electrically connected to the ground terminal VSS. Since the first current sink unit 113 transfers the current transferred from the first signal input unit 112 to the ground terminal VSS, a node, at which the first current sink unit 113 and the first signal input unit 112 are electrically connected to each other, may be called a current sink node.

The second signal input/output unit 120 may generate an output signal OUT in response to an input bar signal INB when the enable signal EN is enabled at a high level. For example, when the enable signal EN is enabled at a high level, the second signal input/output unit 120 may output the output signal OUT as a low level signal if the input bar signal INB is at a high level. When the enable signal EN is enabled at a high level, the second signal input/output unit 120 may output the output signal OUT as a high level signal if the input bar signal INB is at a low level. In this case, the input signal IN and the input bar signal INB may be signals having a differential relation and levels different from each other, and the output bar signal OUTB and the output signal OUT may also be signals having a differential relation and levels different from each other. Furthermore, the input signal IN may include a clock signal which is periodically transitioned. In some embodiments, the input bar signal INB may include a clock bar signal which is periodically transitioned.

The second signal input/output unit 120 may include a second resistive unit 121, a second signal input unit 122, and a second current sink unit 123.

The second resistive unit 121 may include a second resistive element R2. The second resistive element R2 receives the external voltage VDD through one end thereof.

The second signal input unit 122 may transfer a current transferred from the second resistive unit 121 to the second current sink unit 123 by a current amount corresponding to a voltage level of the input bar signal INB. For example, the second signal input unit 122 may transfer a large amount of current to the second current sink unit 123 as the voltage level of the input bar signal INB increases.

The second signal input unit 122 may include a fourth transistor N4. The fourth transistor N4 has a gate that receives the input bar signal INB, a drain electrically connected to the other end of the second resistive element R2, and a source electrically connected to the second current sink unit 123. The output bar signal OUTB is outputted from a node at which the second resistive unit 121 and the second signal input unit 122 are electrically connected to each other. Accordingly, the node, at which the second resistive unit 121 and the second signal input unit 122 are electrically connected to each other, may be called an output node.

When the enable signal EN is enabled, the second current sink unit 123 may transfer a current transferred from the second signal input unit 122 to the ground terminal VSS by a current amount corresponding to the voltage level of the bias voltage BIAS.

The second current sink unit 123 may include fifth and sixth transistors N5 and N6. The fifth transistor N5 has a gate that receives the enable signal EN and a drain electrically connected to the source of the fourth transistor N4. The sixth transistor N6 has a gate that receives the bias voltage BIAS, a drain electrically connected to a source of the fifth transistor N5, and a source electrically connected to the ground terminal VSS. Since the second current sink unit 123 transfers the current transferred from the second signal input unit 122 to the ground terminal VSS, a node, at which the second current sink unit 123 and the second signal input unit 122 are electrically connected to each other, may be called a current sink node.

The connection unit 130 may operate the buffering circuit 100 in one of an equalizing mode and a duty correction mode in response to a mode selection signal MS_s. The connection unit 130 may electrically connect or disconnect the first and second signal input/output units 110 and 120 to or from (to/from) each other in response to the mode selection signal MS_s. For example, when the mode selection signal MS_s is enabled, at a high level, the connection unit 130 may electrically connect the first and second signal input/output units 110 and 120 to each other, thereby operating the buffering circuit 100 in the equalizing mode. When the mode selection signal MS_s is disabled at a low level, the connection unit 130 may electrically disconnect the first and second signal input/output units 110 and 120 from each other, thereby operating the buffering circuit 100 in the duty correction mode. In some embodiments, the mode selection signal MS_s may include different logic levels. In other embodiments, the mode selection signal MS_s may include different voltage levels. In some embodiments, the mode selection signal MS_s may be fixed to a particular level until changed to another level.

The connection unit 130 may electrically connect and disconnect the output node of the first signal input/output unit 110 and the current sink node of the second signal input/output unit 120 to/from each other in response to the mode selection signal MS_s. The connection unit 130 may electrically connect and disconnect the current sink node of the first signal input/output unit 110 and the output node of the second signal input/output unit 120 to/from each other in response to the mode selection signal MS_s.

The connection unit 130 may include seventh and eighth transistors N7 and N8. The seventh transistor N7 has a gate that receives the mode selection signal MS_s, a drain electrically connected to the output node of the second signal input/output unit 120, that is, the node at which the second resistive unit 121 and the second signal input unit 122 are electrically connected to each other, and a source electrically connected to the current sink node of the first signal input/output unit 110, that is, the node at which the first signal input unit 112 and the first current sink unit 113 are electrically connected to each other. The eighth transistor N8 has a gate that receives the mode selection signal MS_s, a drain electrically connected to the output node of the first signal input/output unit 110, that is, the node at which the first resistive unit 111 and the first signal input unit 112 are electrically connected to each other, and a source electrically connected to the current sink node of the second signal input/output unit 120, that is, the node at which the second signal input unit 122 and the second current sink unit 123 are electrically connected to each other. The seventh and eighth transistors N7 and N8 may be smaller than the first and fourth transistors N1 and N4 of the first and second signal input units 112 and 122 in size.

The capacitor C is electrically connected between the first and second signal input/output units 110 and 120. The capacitor C is electrically connected between the current sink nodes of the first and second signal input/output units 110 and 120. That is, the capacitor C is electrically connected between the node, at which the first signal input unit 112 and the first current sink unit 113 are electrically connected to each other, and the node at which the second signal input unit 122 and the second current sink unit 123 are electrically connected to each other.

Hereinafter, an operation of the buffering circuit configured as above in accordance with an embodiment will be described with reference to a graph.

When a transition frequency of the input signal IN and the input bar signal INB increases (HF: high frequency), the capacitor C may electrically connect the first and second signal input/output units 110 and 120 to each other. The following description is about the input signal IN and the input bar signal INB when the capacitor C has a low transition frequency (LF: low frequency) enough for electrically disconnecting the first and second signal input/output units 110 and 120 from each other.

A description will be provided for a case where the enable signal EN is enabled and the mode selection signal MS_s is disabled at a low level.

When the mode selection signal MS_s is disabled at a low level, the first and second signal input/output units 110 and 120 are electrically disconnected from each other.

When the input signal IN at a high level is inputted to the first signal input/output unit 110, the first signal input/output unit 110 outputs the output bar signal OUTB at a low level. When the input signal IN at a low level is inputted to the first signal input/output unit 110, the first signal input/output unit 110 outputs the output bar signal OUTB at a high level. For example, the first signal input/output unit 110 outputs the output bar signal OUTB at a low level as the level of the input signal IN increases, and outputs the output bar signal OUTB at a high level as the level of the input signal IN decreases.

When the input bar signal INB at a high level is inputted to the second signal input/output unit 120, the second signal input/output unit 120 outputs the output signal OUT at a low level. When the input bar signal INB at a low level is inputted to the second signal input/output unit 120, the second signal input/output unit 120 outputs the output signal OUT at a high level. For example, the second signal input/output unit 120 outputs the output signal OUT at a low level as the level of the input bar signal INB increases, and outputs the output signal OUT at a high level as the level of the input bar signal INB decreases.

The first and second signal input/output units 110 and 120, which are electrically disconnected from each other by the mode selection signal MS_s disabled at a low level, may output the output signals OUT and OUTB having voltage levels corresponding to the signals (IN and INB) inputted thereto, respectively.

A description will be provided for a case where the enable signal EN is enabled and the mode selection signal MS_s is enabled at a high level.

When the mode selection signal MS_s is enabled at a high level, the first and second signal input/output units 110 and 120 are electrically connected to each other. As described above, the input signal IN and the input bar signal INB are signals having a differential relation.

When the mode selection signal MS_s is enabled, the first resistive unit 111 of the first signal input/output unit 110 and the second current sink unit 123 of the second signal input/output unit 120 are electrically connected to each other. Furthermore, when the mode selection signal MS_s is enabled, the second resistive unit 121 of the second signal input/output unit 120 and the first current sink unit 113 of the first signal input/output unit 110 are electrically connected to each other.

When the voltage level of the input signal IN increases, the voltage level of the input bar signal INB decreases.

As the voltage level of the input signal IN increases, the first signal input unit 112 transfers a large amount of current provided from the first resistive unit 111 to the first current sink unit 113. Furthermore, the current provided from the first resistive unit 111 is transferred to the second current sink unit 123 through the connection unit 130.

Accordingly, when the voltage level of the input signal IN increases, the first signal input/output unit 110 decreases the voltage level of the output bar signal OUTB through the two current sink units 113 and 123, so that it is possible to more quickly decrease the voltage level of the output bar signal OUTB and to generate the output bar signal OUTB having a lower voltage level as compared with a case where the voltage level of the output bar signal OUTB is decreased through one current sink unit 113 (when the mode selection signal MS_s is disabled).

As the voltage level of the input bar signal INB increases, the second signal input unit 122 transfers a large amount of current provided from the second resistive unit 121 to the second current sink unit 123. Furthermore, the current provided from the second resistive unit 121 is transferred to the first current sink unit 113 through the connection unit 130.

Accordingly, when the voltage level of the input bar signal INB increases, the second signal input/output unit 120 decreases the voltage level of the output signal OUT through the two current sink units 113 and 123, so that it is possible to more quickly decrease the voltage level of the output signal OUT and to generate the output signal OUT having a lower level as compared with a case where the voltage level of the output signal OUT is decreased through one current sink unit 113 (when the mode selection signal MS_s is disabled).

As the voltage level of the input signal IN decreases, the first signal input unit 112 provides the first current sink unit 113 with a small amount of current. When the voltage level of the input signal IN decreases, the voltage level of the input bar signal INB increases. The second signal input unit 122 provides the second current sink unit 123 with a large amount of current. Since the second current sink unit 123, which allows only a constant amount of current to flow through the ground terminal VSS, receives a large amount of current from the second signal input unit 122, the second current sink unit 123 allows a small amount of current provided from the first resistive unit 111 through the connection unit 130 to flow through the ground terminal VSS.

Accordingly, the first signal input/output unit 110 can generate the output bar signal OUTB at a high level as the voltage level of the input signal IN decreases.

As the voltage level of the input bar signal INB decreases, the second signal input unit 122 provides the second current sink unit 123 with a small amount of current. When the voltage level of the input bar signal INB decreases, the voltage level of the input signal IN increases. The first signal input unit 112 provides the first current sink unit 113 with a large amount of current. Since the first current sink unit 113, which allows only a constant amount of current to flow through the ground terminal VSS, receives a large amount of current from the first signal input unit 112, the first current sink unit 113 allows a small amount of current provided from the second resistive unit 121 through the connection unit 130 to flow through the ground terminal VSS.

Accordingly, the second signal input/output unit 120 can generate the output signal OUT at a high level as the voltage level of the input bar signal INB decreases.

According to the buffering circuit 100 in accordance with an embodiment, the first and second signal input/output units 110 and 120 are electrically disconnected from each other according to the mode selection signal, so that the output signal and the output bar signal can be generated in response to the input signal and the input bar signal, respectively. In this case, since the output signal is generated in response to only the input signal and the output bar signal is generated in response to only the input bar signal, it is possible to generate the output (bar) signals having substantially the same waveform as those of the input (bar) signals, so that the duty of the signal is not distorted. When the first and second signal input/output units 110 and 120 are electrically disconnected from each other by the mode selection signal and the buffering circuit 100 operates, it can be said that the buffering circuit 100 operates in the duty correction mode.

Furthermore, according to the buffering circuit 100 in accordance with an embodiment, the first and second signal input/output units 110 and 120 are electrically connected to each other according to the mode selection signal, so that the input signal and the input bar signal may have an influence on the generation of the output signal and the output bar signal. When the level of the input signal increases, since the level of the input bar signal decreases, it is possible to more quickly decrease the voltage levels of the output (bar) signals and to generate the output (bar) signals having a lower voltage level. When the first and second signal input/output units 110 and 120 are electrically connected to each other by the mode selection signal and the buffering circuit 100 operates, since a change of output with respect to input is large as compared with the case where the first and second signal input/output units 110 and 120 are electrically disconnected from each other, a high gain can be obtained. Accordingly, when the first and second signal input/output units 110 and 120 are electrically connected to each other by the mode selection signal and the buffering circuit 100 operates, it can be said that the buffering circuit 100 operates in the equalizing mode.

Figure 3:
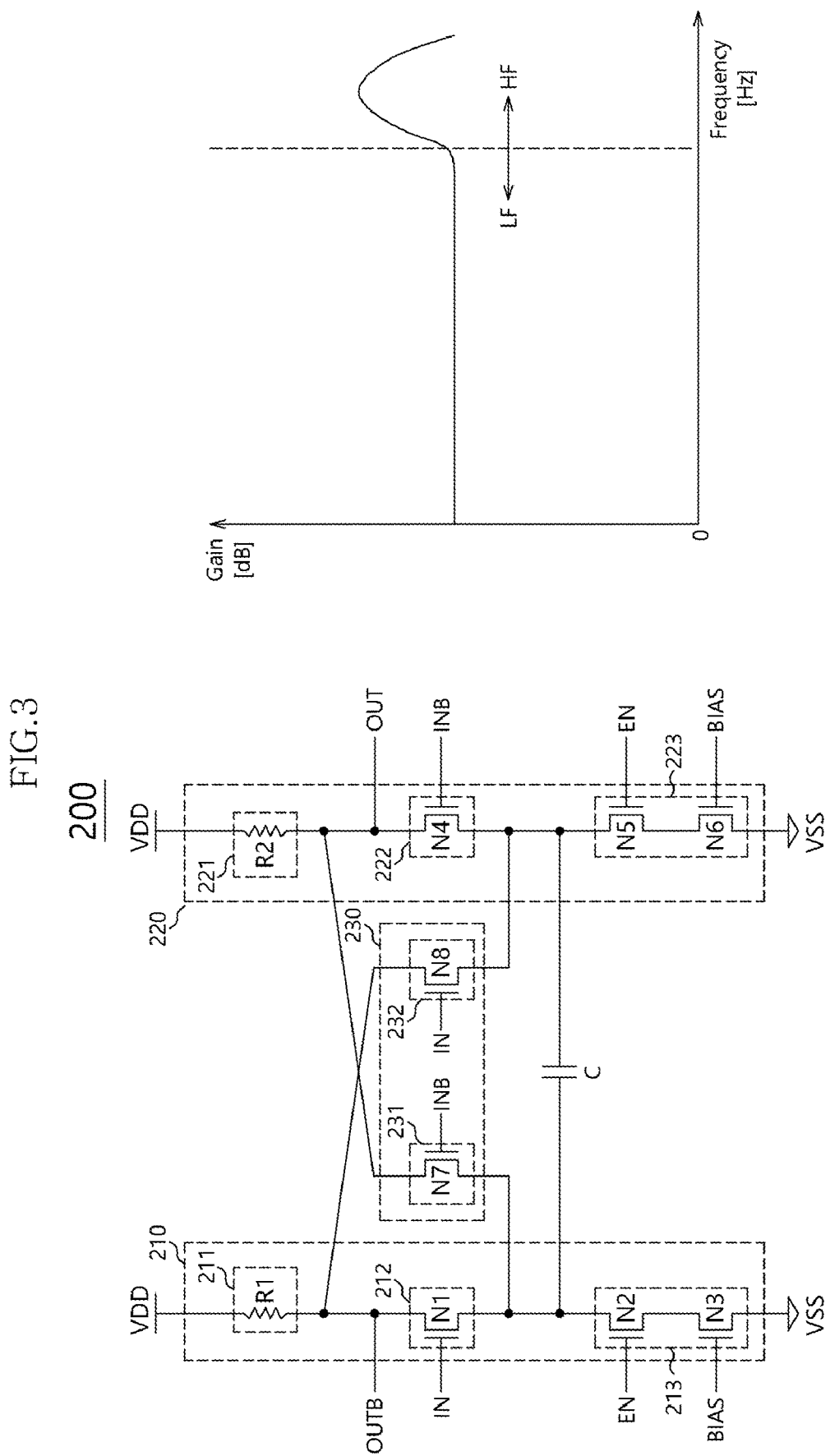
FIG. 3 is a configuration diagram and a graph of a buffering circuit in accordance with an embodiment.

The first to third reception circuits 1200, 2100, and 2200 illustrated in FIG. 1 may include a buffering circuit 200 illustrated in FIG. 3, respectively.

As illustrated in FIG. 3, the buffering circuit 200 may include a first signal input/output unit 210, a second signal input/output unit 220, a connection unit 230, and a capacitor C.

The first signal input/output unit 210 may generate an output bar signal OUTB in response to an input signal IN when an enable signal EN is enabled at a high level. For example, when the enable signal EN is enabled at a high level, the first signal input/output unit 210 may output the output bar signal OUTB as a low level signal if the input signal IN is at a high level. When the enable signal EN is enabled at a high level, the first signal input/output unit 210 may output the output bar signal OUTB as a high level signal if the input signal IN is at a low level.

The first signal input/output unit 210 may include a first resistive unit 211, a first signal input unit 212, and a first current sink unit 213.

The first resistive unit 211 may include a first resistive element R1. The first resistive element R1 receives an external voltage VDD through one end thereof.

The first signal input unit 212 may transfer a current transferred from the first resistive unit 211 to the first current sink unit 213 by a current amount corresponding to a voltage level of the input signal IN. For example, the first signal input unit 212 may transfer a large amount of current to the first current sink unit 213 as the voltage level of the input signal IN increases.

The first signal input unit 212 may include a first transistor N1. The first transistor N1 has a gate that receives the input signal IN, a drain electrically connected to the other end of the first resistive element R1, and a source electrically connected to the first current sink unit 213. The output bar signal OUTB is outputted from a node at which the first resistive unit 211 and the first signal input unit 212 are electrically connected to each other. Accordingly, the node, at which the first resistive unit 211 and the first signal input unit 212 are electrically connected to each other, may be called an output node.

When the enable signal EN is enabled, the first current sink unit 213 may transfer a current transferred from the first signal input unit 212 to a ground terminal VSS by a current amount corresponding to a voltage level of a bias voltage BIAS.

The first current sink unit 213 may include second and third transistors N2 and N3. The second transistor N2 has a gate that receives the enable signal EN and a drain electrically connected to the source of the first transistor N1. The third transistor N3 has a gate that receives the bias voltage BIAS, a drain electrically connected to a source of the second transistor N2, and a source electrically connected to the ground terminal VSS. Since the first current sink unit 213 transfers the current transferred from the first signal input unit 212 to the ground terminal VSS, a node, at which the first current sink unit 213 and the first signal input unit 212 are electrically connected to each other, may be called a current sink node.

The second signal input/output unit 220 may generate an output signal OUT in response to an input bar signal INB when the enable signal EN is enabled at a high level. For example, when the enable signal EN is enabled at a high level, the second signal input/output unit 220 may output the output signal OUT as a low level signal if the input bar signal INB is at a high level. When the enable signal EN is enabled at a high level, the second signal input/output unit 220 may output the output signal OUT as a high level signal if the input bar signal INB is at a low level. In this case, the input signal IN and the input bar signal INB may be signals having a differential relation and levels different from each other, and the output bar signal OUTB and the output signal OUT may also be signals having a differential relation and levels different from each other. Furthermore, the input signal IN may include a clock signal which is periodically transitioned. In some embodiments, the input bar signal INB may include a clock bar signal which is periodically transitioned.

The second signal input/output unit 220 may include a second resistive unit 221, a second signal input unit 222, and a second current sink unit 223.

The second resistive unit 221 may include a second resistive element R2. The second resistive element R2 receives the external voltage VDD through one end thereof.

The second signal input unit 222 may transfer a current transferred from the second resistive unit 221 to the second current sink unit 223 by a current amount corresponding to a voltage level of the input bar signal INB. For example, the second signal input unit 222 may transfer a large amount of current to the second current sink unit 223 as the voltage level of the input bar signal INB increases.

The second signal input unit 222 may include a fourth transistor N4. The fourth transistor N4 has a gate that receives the input bar signal INB, a drain electrically connected to the other end of the second resistive element R2, and a source electrically connected to the second current sink unit 223. The output bar signal OUTB is outputted from a node at which the second resistive unit 221 and the second signal input unit 222 are electrically connected to each other. Accordingly, the node, at which the second resistive unit 221 and the second signal input unit 222 are electrically connected to each other, may be called an output node.

When the enable signal EN is enabled, the second current sink unit 223 may transfer a current transferred from the second signal input unit 222 to the ground terminal VSS by a current amount corresponding to the voltage level of the bias voltage BIAS.

The second current sink unit 223 may include fifth and sixth transistors N5 and N6. The fifth transistor N5 has a gate that receives the enable signal EN and a drain electrically connected to the source of the fourth transistor N4. The sixth transistor N6 has a gate that receives the bias voltage BIAS, a drain electrically connected to a source of the fifth transistor N5, and a source electrically connected to the ground terminal VSS. Since the second current sink unit 223 transfers the current transferred from the second signal input unit 222 to the ground terminal VSS, a node, at which the second current sink unit 223 and the second signal input unit 222 are electrically connected to each other, may be called a current sink node.

The connection unit 230 may electrically connect or disconnect the first and second signal input/output units 110 and 120 to or from (to/from) each other in response to the input signal IN and the input bar signal INB. For example, when the input signal IN is at a high level, the connection unit 230 electrically connects the output node of the first signal input/output unit 210 to the current sink node of the second signal input/output unit 220, and when the input signal IN is at a low level, the connection unit 230 electrically disconnects the output node of the first signal input/output unit 210 and the current sink node of the second signal input/output unit 220 from each other. When the input bar signal INB is at a high level, the connection unit 230 electrically connects the output node of the second signal input/output unit 220 to the current sink node of the first signal input/output unit 210, and when the input bar signal INB is at a low level, the connection unit 230 electrically disconnects the output node of the second signal input/output unit 220 and the current sink node of the first signal input/output unit 210 from each other.

The connection unit 230 may include seventh and eighth transistors N7 and N8. The seventh transistor N7 has a gate that receives the input bar signal INB, a drain electrically connected to the output node of the second signal input/output unit 220, that is, the node at which the second resistive unit 221 and the second signal input unit 222 are electrically connected to each other, and a source electrically connected to the current sink node of the first signal input/output unit 210, that is, the node at which the first signal input unit 212 and the first current sink unit 213 are electrically connected to each other. The eighth transistor N8 has a gate that receives the input signal IN, a drain electrically connected to the output node of the first signal input/output unit 210, that is, the node at which the first resistive unit 211 and the first signal input unit 212 are electrically connected to each other, and a source electrically connected to the current sink node of the second signal input/output unit 220, that is, the node at which the second signal input unit 222 and the second current sink unit 223 are electrically connected to each other. The seventh and eighth transistors N7 and N8 may be smaller than the first and fourth transistors N1 and N4 of the first and second signal input units 212 and 222 in size.

The capacitor C is electrically connected between the first and second signal input/output units 210 and 220. The capacitor C is electrically connected between the current sink nodes of the first and second signal input/output units 210 and 220. That is, the capacitor C is electrically connected between the node, at which the first signal input unit 212 and the first current sink unit 213 are electrically connected to each other, and the node at which the second signal input unit 222 and the second current sink unit 223 are electrically connected to each other.

Hereinafter, an operation of the buffering circuit 200 configured as above in accordance with an embodiment will be described.

When a transition frequency of the input signal IN and the input bar signal INB increases (HF: high frequency), the capacitor C may electrically connect the first and second signal input/output units 210 and 220 to each other. The following description is about the input signal IN and the input bar signal INB when the capacitor C has a low transition frequency (LF: low frequency) enough for electrically disconnecting the first and second signal input/output units 210 and 220 from each other.

When the voltage level of the input signal IN increases, the voltage level of the input bar signal INB decreases.

As the voltage level of the input signal IN increases, the first signal input unit 212 transfers a large amount of current provided from the first resistive unit 211 to the first current sink unit 213. Furthermore, the current provided from the first resistive unit 211 is transferred to the second current sink unit 223 through the connection unit 230.

Accordingly, when the voltage level of the input signal IN increases, the first signal input/output unit 210 decreases the voltage level of the output bar signal OUTB through the two current sink units 213 and 223, so that it is possible to more quickly decrease the voltage level of the output bar signal OUTB and to generate the output bar signal OUTB having a lower voltage level.

As the voltage level of the input bar signal INB increases, the second signal input unit 222 transfers a large amount of current provided from the second resistive unit 221 to the second current sink unit 223. Furthermore, the current provided from the second resistive unit 221 is transferred to the first current sink unit 213 through the connection unit 230.

Accordingly, when the voltage level of the input bar signal INB increases, the second signal input/output unit 220 decreases the voltage level of the output signal OUT through the two current sink units 213 and 223, so that it is possible to more quickly decrease the voltage level of the output signal OUT and to generate the output signal OUT having a lower voltage level.

As the voltage level of the input signal IN decreases, the first signal input unit 212 provides the first current sink unit 213 with a small amount of current. When the voltage level of the input signal IN decreases, a current provided to the second current sink unit 223 through the connection unit 230 also decreases. Furthermore, when the voltage level of the input signal IN decreases, the connection unit 230 may electrically disconnect the first signal input unit 212 and the second current sink unit 223 from each other.

Accordingly, the first signal input/output unit 210 may generate the output bar signal OUTB at a high level as the voltage level of the input signal IN decreases.

As the voltage level of the input bar signal INB decreases, the second signal input unit 222 provides the second current sink unit 223 with a small amount of current. When the voltage level of the input bar signal INB decreases, a current provided to the first current sink unit 213 through the connection unit 230 also decreases. Furthermore, when the voltage level of the input bar signal INB decreases, the connection unit 230 may electrically disconnect the second signal input unit 222 and the first current sink unit 213 from each other.

Accordingly, the second signal input/output unit 220 may generate the output signal OUT at a high level as the voltage level of the input bar signal INB decreases.

According to the buffering circuit 200 in accordance with an embodiment, when the input (bar) signals are at a high level, the first and second signal input/output units 210 and 220 are electrically connected to each other and the output (bar) signals can be more quickly formed at a lower voltage level, so that a high gain can be obtained. Furthermore, according to the buffering circuit 200 in accordance with an embodiment, when the input (bar) signals are at a low level, the first and second signal input/output units 210 and 220 are electrically disconnected from each other and the output (bar) signals are generated according to the levels of the input (bar) signals, so that duty correction is possible. Moreover, the output signal is generated by the input signal and the input bar signal and the output bar signal is generated by the input signal and the input bar signal, so that it is possible to reduce a skew of the output signal and the output bar signal.

An equivalent circuit of the buffering circuit 200 illustrated in FIG. 3 in accordance with an embodiment may be illustrated in FIG. 4.

FIG. 4 illustrates a lower circuit based on the first and second signal input units 212 and 222 as an equivalent circuit, wherein the connection unit 230, to which the input (bar) signals IN and INB are inputted, may be illustrated by a resistive component R and an additional capacitor component $\Delta C$. The resistive component R is generated by the seventh and eighth transistors N7 and N8 included in the connection unit 230. Differently from the buffering circuit 100 illustrated in FIG. 2, in the buffering circuit 200 illustrated in FIG. 3, since the connection unit 230 receives the input (bar) signals IN and INB, the first and second signal input/output units 210 and 220 are repeatedly electrically connected and disconnected to/from each other by the connection unit 230, so that the capacitor component $\Delta C$ is additionally generated. Due to such an additional capacitor component $\Delta C$, the buffering circuit 200 illustrated in FIG.

3 can obtain a higher gain as compared with the buffering circuit 100 illustrated in FIG. 2.

While various embodiments have been described above, it will be understood to those skilled in the art that the embodiments described are examples only. Accordingly, the buffering circuit, and the semiconductor apparatus and the system including the same described herein should not be limited based on the described embodiments.

What is claimed is:

1. A buffering circuit comprising:
   a first signal input and output (input/output) unit configured to generate an output bar signal in response to an input signal;
   a second signal input/output unit configured to generate an output signal in response to an input bar signal;
   a connection unit configured to electrically connect and disconnect an output node of the first signal input/output unit and a current sink node of the second signal input/output unit to or from (to/from) each other in response to a control signal, and to electrically connect and disconnect a current sink node of the first signal input/output unit and an output node of the second signal input/output unit to/from each other in response to the control signal; and
   a capacitor coupled between the first and second signal input/output units and configured to electrically connect the first signal input/output unit to the second signal input/output unit.

2. The buffering circuit according to claim 1, wherein the first signal input/output unit comprises:
   a resistive unit having a first end that receives an external voltage and a second end to which the output node of the first signal input/output unit is electrically connected;
   a signal input unit configured to transfer a current, which is received from the resistive unit, to the current sink node of the first signal input/output unit in response to the input signal; and
   a current sink unit configured to transfer a current, which is received from the current sink node of the first signal input/output unit, to a ground terminal.

3. The buffering circuit according to claim 2, wherein the current sink unit provides the ground terminal with a current amount corresponding to a bias voltage level from the current sink node of the first signal input/output unit when an enable signal is enabled.

4. The buffering circuit according to claim 1, wherein the second signal input/output unit comprises:
   a resistive unit having a first end that receives an external voltage and a second end to which the output node of the second signal input/output unit is electrically connected;
   a signal input unit configured to transfer a current, which is received from the resistive unit, to the current sink node of the second signal input/output unit in response to the input bar signal; and
   a current sink unit configured to transfer a current, which is received from the current sink node of the second signal input/output unit, to a ground terminal.

5. The buffering circuit according to claim 4, wherein the current sink unit provides the ground terminal with a current amount corresponding to a bias voltage level from the current sink node of the second signal input/output unit when an enable signal is enabled.

6. The buffering circuit according to claim 1, wherein the control signal includes a mode selection signal having different levels.

7. The buffering circuit according to claim 6, wherein, when the mode selection signal is enabled, the connection unit electrically connects the output node of the first signal input/output unit and the current sink node of the second signal input/output unit to each other and electrically connects the current sink node of the first signal input/output unit and the output node of the second signal input/output unit to each other.

8. The buffering circuit according to claim 6, wherein, when the mode selection signal is disabled, the connection unit electrically disconnects the output node of the first signal input/output unit and the current sink node of the second signal input/output unit from each other and electrically disconnects the current sink node of the first signal input/output unit and the output node of the second signal input/output unit from each other.

9. The buffering circuit according to claim 1, wherein the control signal includes the input signal and the input bar signal.

10. The buffering circuit according to claim 9, wherein, when the input signal is at a high level, the connection unit electrically connects the output node of the first signal input/output unit and the current sink node of the second signal input/output unit to each other, and when the input bar signal is at a high level, the connection unit electrically connects the current sink node of the first signal input/output unit and the output node of the second signal input/output unit to each other.

11. The buffering circuit according to claim 9, wherein, when the input signal is at a low level, the connection unit electrically disconnects the output node of the first signal input/output unit and the current sink node of the second signal input/output unit from each other, and when the input bar signal is at a low level, the connection unit electrically disconnects the current sink node of the first signal input/output unit and the output node of the second signal input/output unit from each other.

12. The buffering circuit according to claim 1, wherein the input signal includes a clock signal which is periodically transitioned and the input bar signal includes a clock bar signal which is periodically transitioned.

13. The buffering circuit according to claim 1,
   wherein the connection unit includes a first switch configured to electrically connect and disconnect the output node of the first signal input/output unit and the current sink node of the second signal input/output unit to/from each other in response to the control signal, and
   wherein the connection unit includes a second switch configured to electrically connect and disconnect the current sink node of the first signal input/output unit and the output node of the second signal input/output unit to/from each other in response to the control signal.

14. A buffering circuit comprising:
   a first signal input unit configured to decrease a level of an output bar signal as a level of an input signal increases;
   a second signal input unit configured to decrease a level of an output signal as a level of an input bar signal increases; and
   a connection unit configured to additionally decrease the level of the output bar signal as the level of the input signal increases or additionally decrease the level of the output signal as the level of the input bar signal increases based on the input signal and the input bar signal.

15. The buffering circuit according to claim 14, further comprising:
- a first current sink unit configured to transfer a current received from the first signal input unit to a ground terminal; and
- a second current sink unit configured to transfer a current received from the second signal input unit to the ground terminal.

16. The buffering circuit according to claim 15, wherein the connection unit electrically connects and disconnects the first signal input unit and the second current sink unit to or from (to/from) each other in response to the input signal, or
- electrically connects and disconnects the second signal input unit and the first current sink unit to/from each other in response to the input bar signal.

17. A buffering circuit comprising:
- a first signal input and output (input/output) unit configured to generate an output bar signal in response to an input signal;
- a second signal input/output unit configured to generate an output signal in response to an input bar signal; and
- a connection unit configured to electrically connect the first and second signal input/output units to operate the buffer circuit in an equalizing mode and to electrically disconnect the first and second signal input/output units to operate the buffer circuit in a duty correction mode based on the input signal and the input bar signal.

18. The buffering circuit according to claim 17, wherein the output bar signal decreases or increases quicker in the equalizing mode in response to the input signal than the output bar signal would increase or decrease in response to the input signal in the duty correction mode.

19. The buffering circuit according to claim 17, wherein the output bar signal has a higher or lower gain in the equalizing mode in response to the input signal than the output bar signal would have in response to the input signal in the duty correction mode.

* * * * *